(12) United States Patent
Bartlett et al.

(10) Patent No.: US 9,775,307 B2
(45) Date of Patent: Oct. 3, 2017

(54) METHODS AND SYSTEMS FOR IMPROVED IRRIGATION SENSOR AND CONTROL COMMUNICATION

(71) Applicant: CREATIVE SENSOR TECHNOLOGY, INC., Rochester, MA (US)

(72) Inventors: Norman Bartlett, Rochester, MA (US); Charles Woringer, North Falmouth, MA (US)

(73) Assignee: CREATIVE SENSOR TECHNOLOGY, INC., Rochester, MA (US)

( * ) Notice: Subject to any disclaimer, the term of this patent is extended or adjusted under 35 U.S.C. 154(b) by 184 days.

(21) Appl. No.: 14/383,409

(22) PCT Filed: Feb. 11, 2014

(86) PCT No.: PCT/US2014/015782
§ 371 (c)(1),
(2) Date: Sep. 5, 2014

(87) PCT Pub. No.: WO2014/124435
PCT Pub. Date: Aug. 14, 2014

(65) Prior Publication Data
US 2015/0327449 A1    Nov. 19, 2015

Related U.S. Application Data

(60) Provisional application No. 61/763,415, filed on Feb. 11, 2013.

(51) Int. Cl.
*A01G 25/16* (2006.01)
*G01R 31/28* (2006.01)

(52) U.S. Cl.
CPC .......... *A01G 25/16* (2013.01); *A01G 25/167* (2013.01); *G01R 31/2829* (2013.01);
(Continued)

(58) Field of Classification Search
CPC .......... A01G 25/16; G05B 2219/2625; Y10T 137/189; Y10T 137/1866; G01R 31/2829
See application file for complete search history.

(56) References Cited

U.S. PATENT DOCUMENTS 5,975,248 A    11/1999 Lewis
7,225,057 B2 *  5/2007 Froman ................ A01G 25/165
                                                        239/69
(Continued)

FOREIGN PATENT DOCUMENTS

GB    2097555 A    11/1982

OTHER PUBLICATIONS

International Search Report and Written Opinion for Application PCT/US2014/015782, dated May 2, 2014, 8 pages.

*Primary Examiner* — Atif Chaudry
(74) *Attorney, Agent, or Firm* — McCarter & English, LLP; Kia L. Freeman, Esq.

(57) ABSTRACT

Disclosed embodiments of the invention include methods and systems for upgrading an existing irrigation system to increase its sensing and control capability without requiring extensive rewiring. A controller module is installed between an irrigation controller and a zone valve and physically proximate to the irrigation controller without disturbing most of the existing wiring between the irrigation controller and the zone valve. A field module is installed between the controller module and the zone valve without disturbing most of the existing wiring between the irrigation controller and the zone valve. The controller module and field module are the communicatively coupled primarily using the exist-
(Continued)

ing wiring. The controller module may encode commands transmitted to the field module and/or decode encoded data transmitted from the field module. The field module may encode data transmitted to the controller module and/or decode encoded commands transmitted from the controller module.

11 Claims, 3 Drawing Sheets

(52) U.S. Cl.
CPC . *G05B 2219/2625* (2013.01); *Y10T 137/0441* (2015.04); *Y10T 137/189* (2015.04); *Y10T 137/1866* (2015.04); *Y10T 137/598* (2015.04)

(56) References Cited

U.S. PATENT DOCUMENTS

| | | | |
|---|---|---|---|
| 7,444,207 B2 * | 10/2008 | Nickerson | A01G 25/16 239/69 |
| 2006/0116793 A1 * | 6/2006 | Christiansen | A01G 25/16 700/284 |
| 2007/0140274 A1 * | 6/2007 | Battistutto | A01G 25/16 370/401 |
| 2008/0251602 A1 | 10/2008 | Leggett et al. | |

* cited by examiner

METHODS AND SYSTEMS FOR IMPROVED IRRIGATION SENSOR AND CONTROL COMMUNICATION

RELATED APPLICATIONS

This application is a 35 U.S.C. §371 national stage application of International Application No. PCT/US2014/015782, filed Feb. 11, 2014, which claims the benefit of U.S. Provisional Application No. 61/763,415, filed Feb. 11, 2013. The entire contents of the foregoing applications is hereby incorporated by reference.

DETAILED DESCRIPTION OF THE INVENTION

The invention is directed to the field of irrigation sensing and control. More particularly, the invention is directed to methods and system for improved irrigation sensing and control without requiring extensive rewiring of an existing irrigation system.

Figure 1:
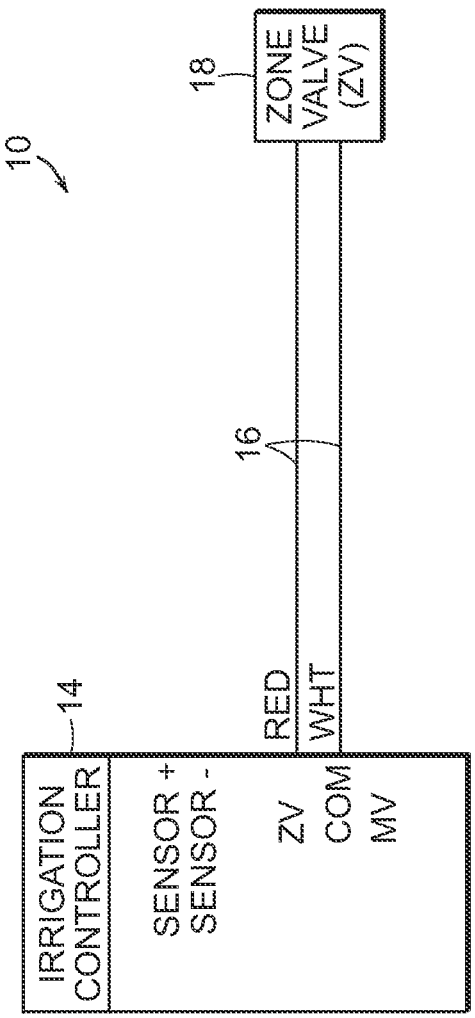
FIG. 1 is a typical existing irrigation sensing and control system 10.

A typical existing irrigation sensing and control system 10 is illustrated in FIG. 1. The system 10 includes an irrigation controller 14, a zone valve 18, and wiring 16 that enables controller 14 to communicate with zone valve 18. A substantial expense in the installation of a typical existing irrigation sensing and control system 10 is the installation of wiring. For example, wiring may be laid underneath pavement. Accordingly, one goal of the methods and systems of the present invention is to avoid the requirement for extensive rewiring of an existing irrigation system when expanding control capabilities and/or sensor inputs.

Figure 2:
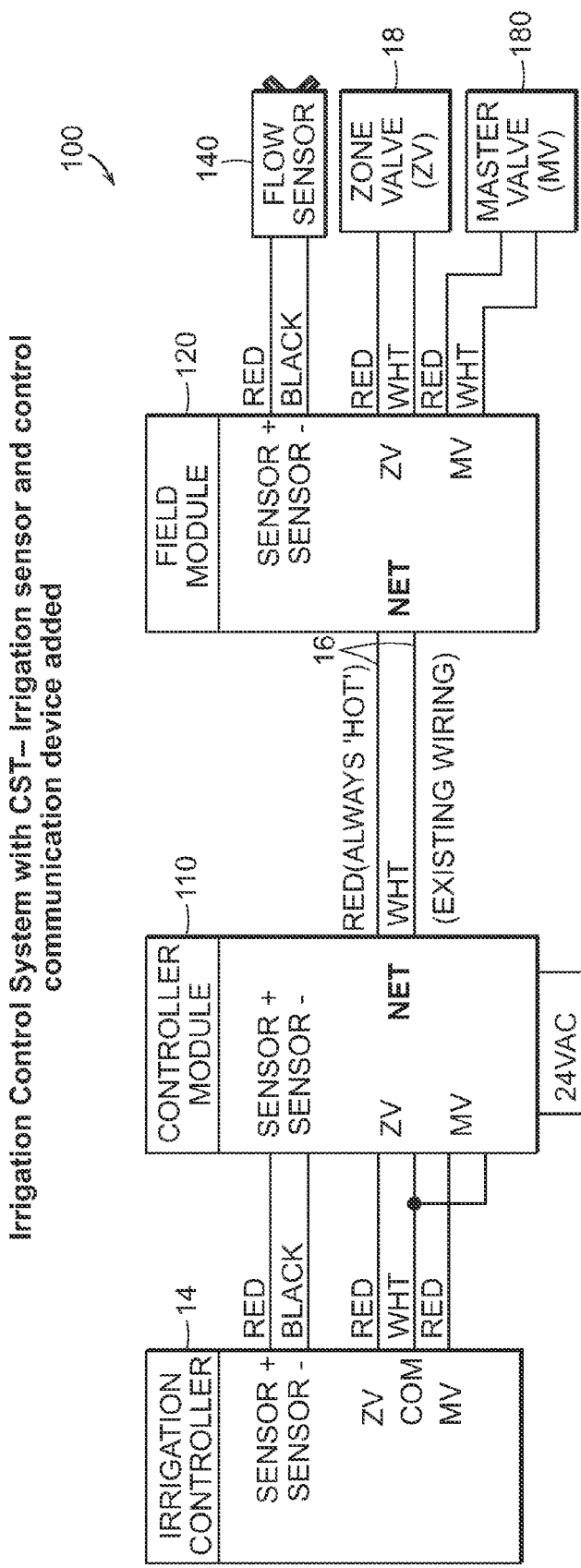
FIG. 2 illustrates an improved irrigation sensing and control system 100 in accordance with one embodiment of the invention.

FIG. 2 illustrates an improved irrigation sensing and control system 100 in accordance with one embodiment of the invention. System 100 includes existing irrigation controller 14, existing zone valve 18, and at least portions of wiring 16. System 100 further includes new elements to enable collection of additional sensor signals and control based on the additional sensor signals. In FIG. 2, exemplary system 100 further includes a controller module 110, a field module 120, a master valve 180, and sensor 140.

Controller module 110 is added to an irrigation system between zone valve 18 and irrigation controller 14, relatively near irrigation controller 14 such that most of the original wiring system need not be disturbed. Controller module 110 may require a power supply, such as the 24 VAC power input illustrated in FIG. 2. Controller module 110 is coupled to irrigation controller 14 to enable communication of both information and control signals between module 110 and controller 14. As illustrated in FIG. 2, the communication between module 110 and controller 14 may require multiple sets of wiring between module 110 and controller 14.

Field module 120 is also added between irrigation controller 14 and zone valve 18, and may be located relatively near irrigation zone valve 18 such that most of the original wiring 16 need not be disturbed. Sensor 140 is added to provide additional sensor information and signals that can be used to provide better control of the irrigation system. Master valve 180 is also added to enable improved control of the irrigation system. Sensor 140, master valve 180, and zone valve 18 are each coupled to field module 120 to enable communication of information via field module 120 to controller module 110 and controller 14. Zone valve 18 may be coupled to field module 120 with the existing pair of zone valve wires. Additional pairs of wires may be added to couple field module 120 with the sensor 140 and the master valve 180. Field module 120 may also enable communication of control signals to master valve 180 and/or zone valve 18.

Additional sensors may also be added to system 100 and coupled to field module 120. In FIG. 2, sensor 140 is a flow sensor, but one of ordinary skill will appreciate that other sensors can be used instead of, or in addition to, sensor 140 and can also provide additional sensor information and signals that can be used to provide better control of the irrigation system.

Controller module 110 and field module 120 are coupled to each other with wiring 16. Controller module 110 and field module 120 are configured to enable wiring 16 to expand its signal communication capacity to enable new sensor information, such as from sensor 140 and/or master valve 180, to be communicated by the field module 120 to controller module 110 and new control information to be communicated by controller module 110 to the field module 120, which may then be communication to sensor 140, zone valve 18, and master valve 180. For example, controller module 110 and field module 120 can each encode and/or decode information communication via wiring 16 thereby significantly expanding the communication capacity of wiring 16. In particular, controller module 110 can encode information that it sends to field module 120 and decode information it receives from field module 120 thereby significantly expanding the communication capacity of wiring 16. Similarly, field module 120 can encode information that it sends to controller module 110 and decode information it receives from controller module 110. Thus, Thus, existing wiring 16 can be used to accommodate a level of communication well beyond its intended capacity.

One of skill in the art will appreciate that system 100 may further be expanded with one or more additional field modules 120. Each additional field module 120 could be coupled to its own associated sensor(s) and/or valve(s). Moreover, each field modules 120 could be configured to expand the communication capacity of wiring 16—by means similar to that used to communicate between controller module 110 and one field module 120.

In the following description, exemplary products consistent with embodiments of the invention are described. An exemplary product generally comprises elements added to an existing irrigation system as described.

This product will utilize existing irrigation zone valve power and common wires as a signal carrier to add sensor inputs and control outputs to retrofit existing irrigation control systems. Variants of this device may also exploit other installed and unused wiring such as telephone wire pairs, coaxial cables, etc.

These sensor inputs will be used by the irrigation controller to enhance its control capabilities. The primary control input is a rate of flow sensor installed in the irrigation piping but may include (but not limited to):

soil moisture sensors water pressure sensors
tank level sensors
wind speed sensors
temperature sensors
speed sensors
or any other analog or digital sensor Control outputs, typically low voltage electrical switch closures, will affect the change initiated by the controller. The primary control output will operate a solenoid actuated master shut off valve but may alternately start or stop other devices.

As with the inputs above, additional control outputs may include (but not limited to):
analog output control signals;
digital control signals; and/or
multiple or additional contact closure outputs Additional features of an embodiment of the invention may include:

1. Operational status may be indicated by LEDs, simple indicators, or other interfaces on field module 120 and/or the controller module 110. Status may be indicated continually, intermittently, or by request. For example, the operation status may show:
the communications network is operational;
the status of the zone valve 18;
the status of the flow sensor 140; and/or
the status of the master valve 180

2. Diagnostic feedback may be indicated by LEDs, simple indicators, or other interfaces on field module 120 and/or the controller module 110. Feedback may be indicated continually, intermittently, or by request. The feedback may show for example:
Condition of the power supply;
Operation of the processors in each module 110 and 120;
Condition of the communication path 16;
Condition of zone valve 18 output;
Condition of flow sensor 140 input; and/or
Condition of the master valve 180 output To further explain this product, the example of a flow sensor and a master shut off valve will be used.

3. This product will reduce the scope of the work involved in adding a flow sensor input and master valve output to an existing irrigation system by using installed field wiring as a data path. Utilizing the wire path to a zone valve close to the intended flow sensor/master valve location may eliminate significant site work and expense.

4. This product will generally include two separate modules; a "controller module" that will typically be installed at the existing irrigation controller and a "field module" that will typically be installed at the location of an existing zone control valve (or other similarly wired device) near the intended location of a new sensor and/or a new master valve.

5. The zone valve, whose power wire and common are used as the data path, may remain operational from the irrigation controller exactly as if it were still conventionally wired.

6. The flow sensor may report flow rate to the irrigation controller as if it were wired conventionally (with network delays).

7. The master valve controlled by this device may operate as if it were conventionally wired to the controller (with network delays).

Figure 3:
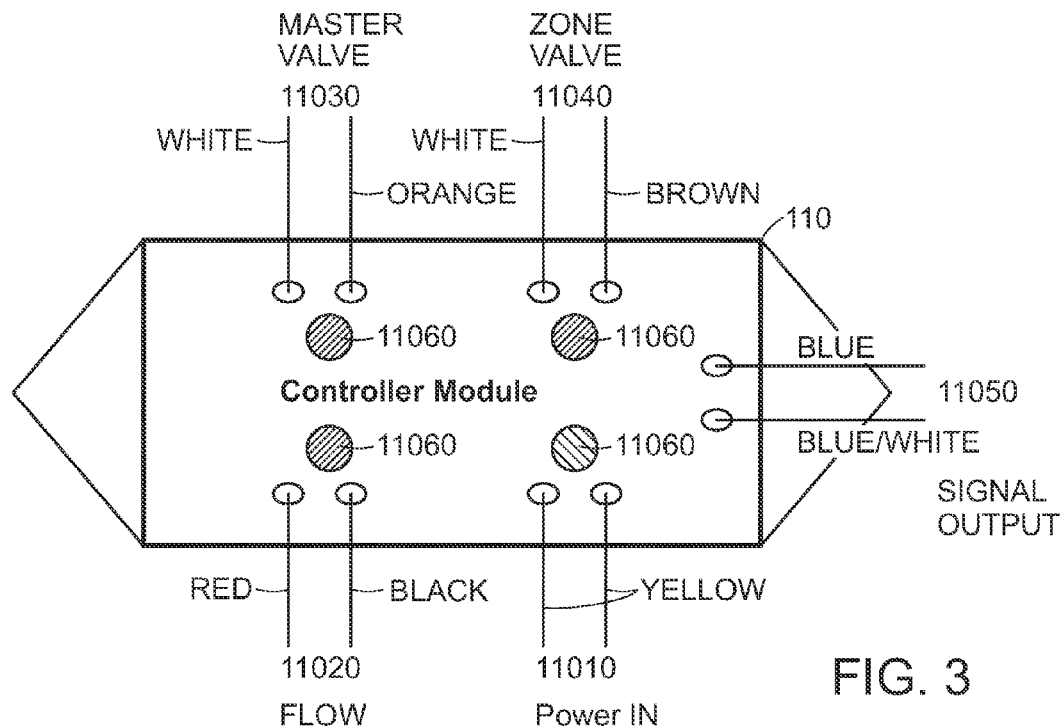
FIG. 3 illustrates an exemplary controller module in accordance with one embodiment of the invention.

8. An exemplary controller module 110 in accordance with one embodiment of the invention is illustrated in FIG. 3. The Controller Module (CM) may be a circuit board, which may be housed in a NEMA 1 enclosure with external terminal strips. Preferably, it will be installed in a protected location near the irrigation controller. Other types of enclosures may be used. Indicators will be visible from the exterior of the enclosure. For example, LED indicators may be visible through the exterior of the enclosure. Connections will be made, for example, via 5 separate two wire terminal strips labeled by function as follows:

Terminal 1 (11010): Input Power—nominal 24 VAC (28.5 to 30 VAC irrigation style)

Terminal 2 (11020): Flow Sensor—isolated output to controller flow sensor input Terminal 3 (11030): Master Valve—isolated Input from controller master valve output—
Controller MV Common and Controller Master Valve Output Note: The "Common" connection for the master valve on the controller may be shared with the "Valve Common". All the zone valve wires on the project, including the one(s) this device may use as a carrier may be electrically connected both inside the irrigation controller and in the underground field wiring.

Terminal 4 (11040): Zone Valve—isolated input from controller zone valve output—Controller Zone Valve Common and Controller Valve Output of zone valve wire that may be used as the carrier.

Terminal 5 (11050): Network Output—output to field wires that may be used as signal and power carriers to one or more remote valves, sensors, and field modules; typically Zone Valve wire Zone Common.

Indicators (11060), such as LEDs, located adjacent to the wire terminals may indicate operating conditions and aid in diagnostic functions.

Exemplary Indicator Function a. When the Controller Module (CM) is connected to 24 VAC power, a green LED may illuminate to indicate "Power is ON". On start-up, it may blink in a predetermined pattern to indicate processor and network status, then remain "ON". Whenever there is a network transmission, it may blink off and then back on.

b. When the CM is receiving flow data an LED adjacent to the flow leads may blink at a rate of once per second. When no flow input is present, the LED may be "OFF."

c. When the irrigation controller activates the Master Valve (MV), a corresponding LED on the CM may illuminate to show "Power to the master valve is ON". This illumination may read back from the Field Module (FM) to confirm that the signal was received and action initiated.

d. When the zone valve output is activated, a corresponding LED on the CM may illuminate to show "Power to the zone valve is ON". This illumination may read back from the FM to confirm the signal was received and action initiated.

Figure 4:
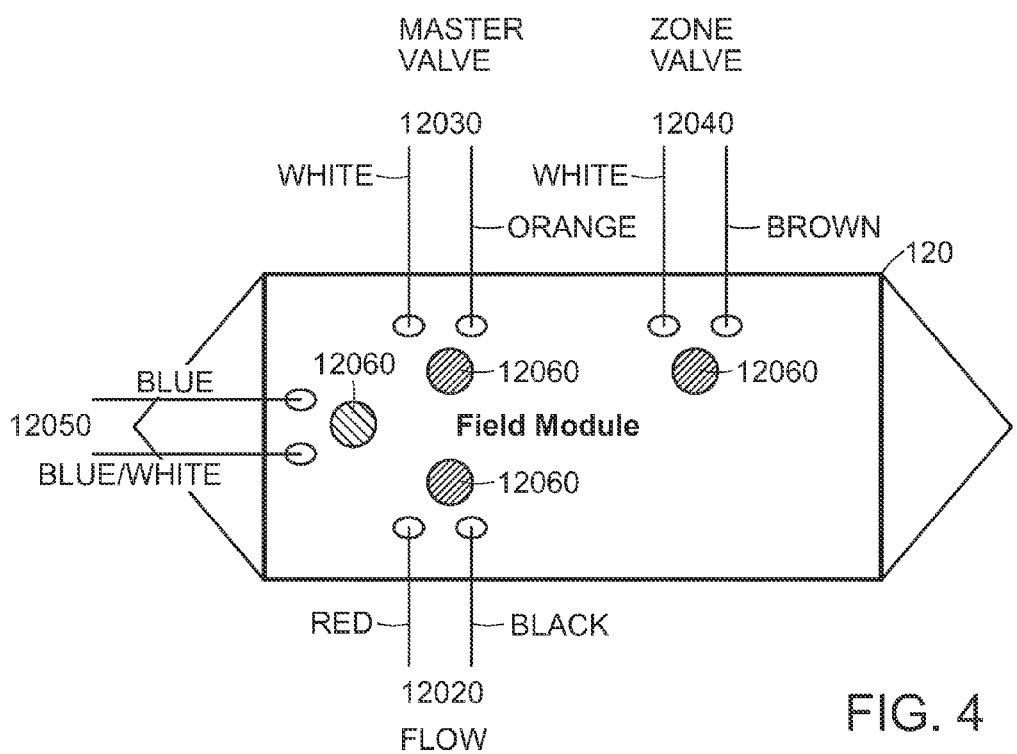
FIG. 4 illustrates an exemplary field module in accordance with one embodiment of the invention.

9. An exemplary field module 120 in accordance with one embodiment of the invention is illustrated in FIG. 4. The Field Module (FM) may be an epoxy encapsulated circuit board. The field module is designed to be installed in the field, typically below grade in valve boxes or underground pits.

Connections may be made via 4 pair of color-coded wire leads. The device may also feature indicators (12060), such as LEDs, adjacent to the pairs of leads to indicate operating conditions and aid in diagnostic functions. The field module may be powered from the controller module over the interconnecting wire path.

Pair 1 (12050): Network input—input from field wires being used as carriers: a Blue lead may connect to former Zone Valve wire and Blue/White striped lead may connect to former Zone Common.

Pair 2 (12020): Flow Sensor—Input from Flow Sensor—Red (+) and Black (−)

Pair 3 (12030): Master Valve—Output to Master Valve—White and Orange to Master Valve Solenoid Pair 4 (12040): Zone Valve—Output to Zone Valve Solenoid—White and Brown to valve replacing wires now used as carriers.

Exemplary Indicator Function a. When power is applied to the CM, a green LED on the Field Module (FM) adjacent to the Network Input leads may illuminate to indicate "Power is ON". On start-up, it may blink in a predetermined pattern to indicate processor and network status, then remain "ON". Whenever there is a received network transmission, it may blink off and then back on.

b. When flow sensor is active an LED on the FM may blink approximately once per second. When no flow input is present, the LED may be "OFF".

c. When the irrigation controller activates the Master Valve (MV), a corresponding LED on the FM may illuminate to show "Power to the master valve is ON" and the connection to the solenoid is complete.

d. When the zone valve output is activated, a corresponding LED on the FM may illuminate to show "Power to the zone valve is ON" and the connection to the solenoid is complete.

What is claimed is:

1. A method of upgrading an existing irrigation system, with existing wiring installed between an irrigation controller and a zone valve, to increase its sensing and control capability without disturbing most of the existing wiring, the method comprising:
    installing a controller module between an irrigation controller and a zone valve and physically proximate to the irrigation controller without disturbing most of the existing wiring between the irrigation controller and the zone valve, such that the controller module is electrically coupled to the irrigation controller;
    installing a field module between the controller module and the zone valve without disturbing most of the existing wiring between the irrigation controller and the zone valve, such that the field module is electrically coupled to the zone valve;
    installing at least one sensor such that the at least one sensor is communicatively coupled to the field module;
    installing at least one master valve such that the master valve is communicatively coupled to the field module; and
    communicatively coupling the controller module and the field module primarily using the existing wiring.

2. The method of claim 1 further comprising encoding and transmitting, with the field module, sensor data to the controller module primarily using the existing wiring, thereby expanding the communication capacity of the existing wiring.

3. The method of claim 2 further comprising decoding, with the controller module, sensor data from the field module.

4. The method of claim 1 further comprising encoding and transmitting, with the controller module, control data to the field module primarily using the existing wiring, thereby expanding the communication capacity of the existing wiring.

5. The method of claim 4 further comprising decoding, with the field module, control data from the controller module.

6. The method of claim 5 further comprising transmitting, with the field module, decoded control data to the zone valve.

7. The method of claim 6 further comprising transmitting, with the field module, decoded control data to the master valve.

8. The method of claim 1 further comprising installing a plurality of sensors such that the plurality of sensors are communicatively coupled to the field module.

9. The method of claim 1 further comprising indicating whether the upgraded irrigation system is operational.

10. A method of testing existing wiring of an existing irrigation system in preparation for an upgrade to increase the sensing and control capability of the existing irrigation system without disturbing most of the existing wiring installed between an irrigation controller and a zone valve, the method comprising:
    installing a controller module between an irrigation controller and a zone valve and physically proximate to the irrigation controller without disturbing most of the existing wiring between the irrigation controller and the zone valve;
    installing a field module between the controller module and the zone valve without disturbing most of the existing wiring between the irrigation controller and the zone valve;
    testing the state of the existing wiring by transmitting a command with the controller module to the field module primarily using the existing wiring; and
    indicating, with the field module, if the field module has received the command from the controller module.

11. The method of claim 10, wherein the step of indicating further comprises transmitting a reply with the field module to the controller module if the field module has received the command from the controller module, the method further comprising indicating, with the controller module, if the controller module has received the reply from the field module.

* * * * *